United States Patent
Lin et al.

(10) Patent No.: US 9,330,764 B2
(45) Date of Patent: May 3, 2016

(54) ARRAY FANOUT PASS TRANSISTOR STRUCTURE

(71) Applicant: MACRONIX INTERNATIONAL CO., LTD., Hsinchu (TW)

(72) Inventors: Lee-Yin Lin, Taipei (TW); Teng-Hao Yeh, Hsinchu (TW); Chih-Wei Hu, Miaoli (TW); Chieh-Fang Chen, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 45 days.

(21) Appl. No.: 14/305,782

(22) Filed: Jun. 16, 2014

(65) Prior Publication Data

US 2015/0364196 A1 Dec. 17, 2015

(51) Int. Cl.
| | |
|---|---|
| *G11C 11/34* | (2006.01) |
| *G11C 16/08* | (2006.01) |
| *H01L 21/768* | (2006.01) |
| *H01L 21/266* | (2006.01) |

(52) U.S. Cl.
CPC .............. *G11C 16/08* (2013.01); *H01L 21/266* (2013.01); *H01L 21/76895* (2013.01)

(58) Field of Classification Search
CPC . G11C 16/08; H01L 21/76895; H01L 21/266
USPC .............................. 365/185.1, 185.11, 185.05
See application file for complete search history.

(56) References Cited

U.S. PATENT DOCUMENTS

| | | | |
|---|---|---|---|
| 7,177,169 B2 | 2/2007 | Scheuerlein | |
| 7,180,785 B2 | 2/2007 | Kurihara | |
| 7,200,039 B2 * | 4/2007 | Lee | G11C 16/30 365/185.13 |
| 7,700,997 B2 | 4/2010 | Futatsuyama et al. | |
| 8,363,505 B2 | 1/2013 | Chang et al. | |
| 8,654,591 B2 | 2/2014 | Akaogi | |
| 2007/0121388 A1* | 5/2007 | Lee | G11C 16/30 365/185.29 |
| 2013/0100758 A1 | 4/2013 | Chen et al. | |
| 2013/0148445 A1 | 6/2013 | Chen et al. | |
| 2014/0226427 A1 | 8/2014 | Kim et al. | |
| 2014/0254284 A1 | 9/2014 | Hung et al. | |

* cited by examiner

*Primary Examiner* — Viet Q Nguyen
(74) *Attorney, Agent, or Firm* — Yiding Wu; Haynes Beffel & Wolfeld LLP

(57) ABSTRACT

A device, such as an integrated circuit including memory, includes an array of memory cells on a substrate. A row/column line, such as a local word line or local bit line, is disposed in the array. The row/column line includes a pass transistor structure comprising a semiconductor strip in a first patterned layer over the substrate. The semiconductor strip includes a semiconductor channel body, a contact region on one side of the semiconductor channel body, and an extension on another side of the semiconductor channel body, which reaches into the memory cells in the array. A select line in a second patterned layer crossing the semiconductor channel body is provided. The pass transistor structure can be implemented in a fanout structure for row/column lines in the array.

20 Claims, 17 Drawing Sheets

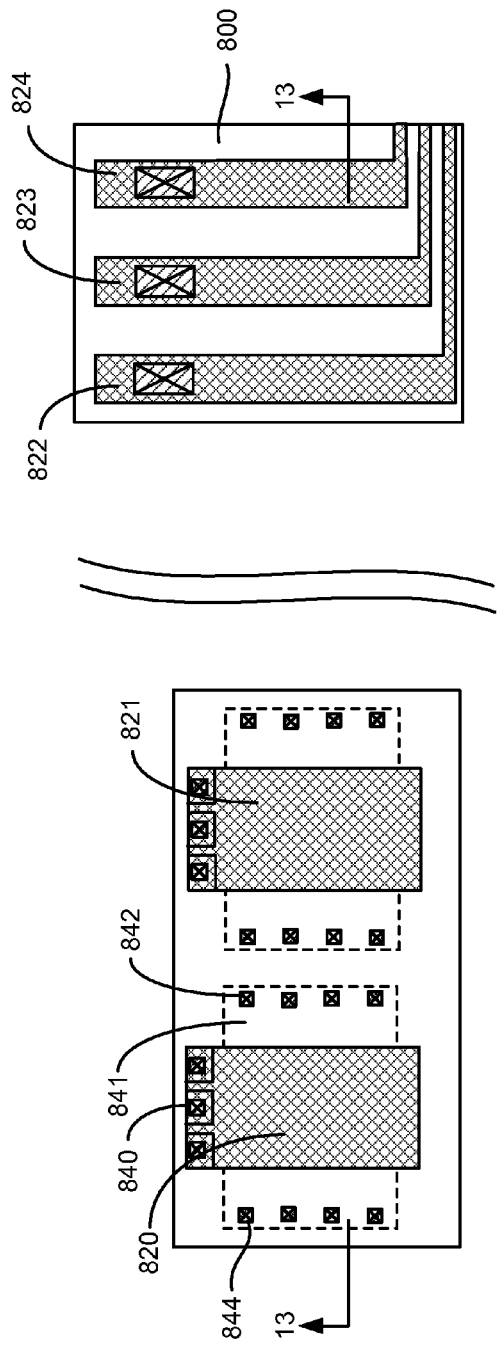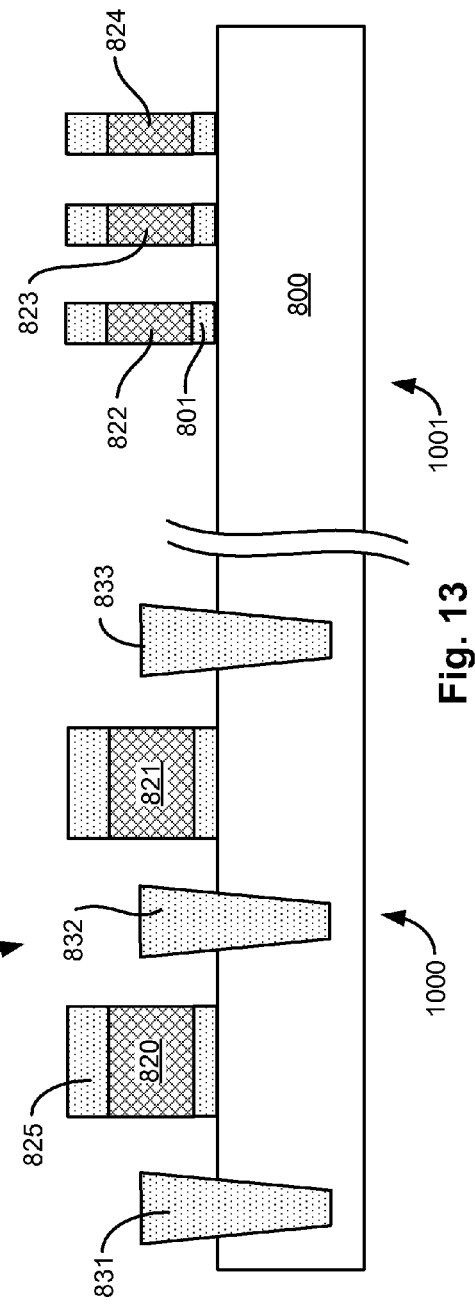

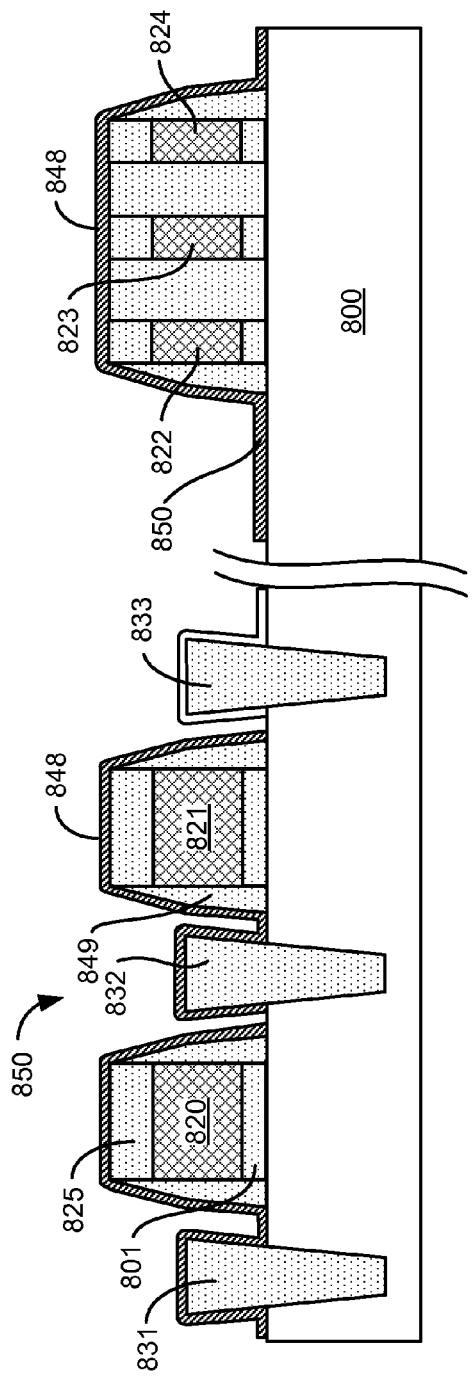
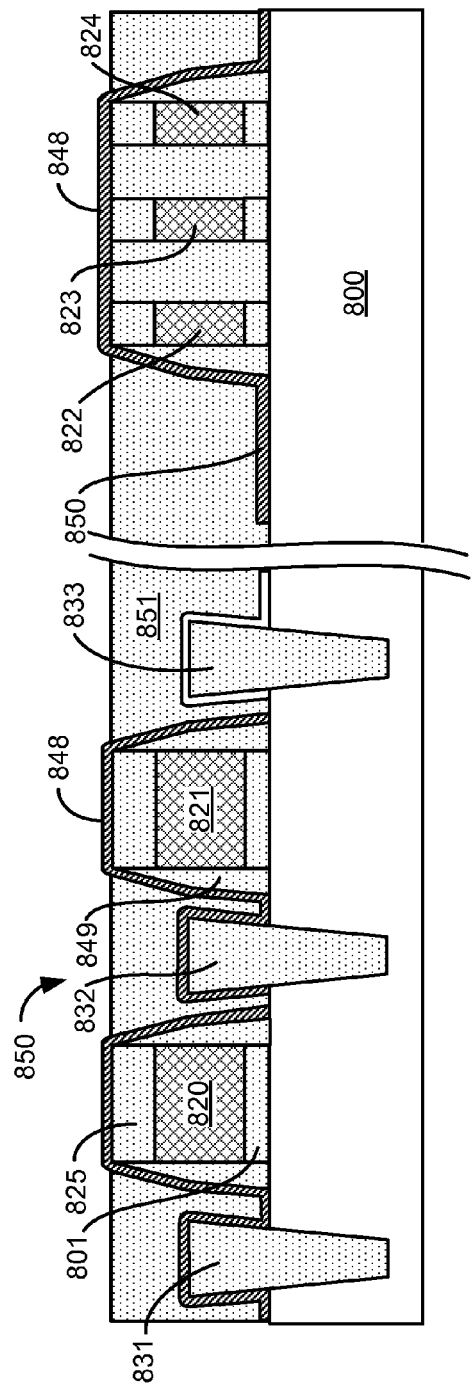

ARRAY FANOUT PASS TRANSISTOR STRUCTURE

BACKGROUND OF THE INVENTION

1. Field of the Invention

The present invention relates to integrated circuit memory, and decoding structures utilized in such devices.

2. Description of Related Art

In high density memory, the arrays of memory cells are often divided into a plurality of blocks of memory cells. Each block of memory cells may include local word lines, requiring corresponding local word line drivers. In these configurations, there can be a global word line driver which drives a set of global word lines for a column of blocks in the array. Each word line in the set of global word lines is set according to the operation being applied to the selected blocks, such as read, program, and erase for high density flash devices. Some operations can require high voltages and some can require negative voltages for some types of memory devices. As a result, word line drivers are required that can meet difficult high voltage and negative voltage operating parameters.

In such high density arrays including a large number of local word line drivers, the area required for implementation of the local word line drivers can become significant overhead and implementation cost of the devices.

It is desirable to provide technology which can reduce the area requirements for local word line drivers, and for similar structures, while meeting the difficult specifications required for such devices.

SUMMARY OF THE INVENTION

A device, such as an integrated circuit including memory, is described which includes an array of memory cells on a substrate. Row/column lines, such as local word lines or local bit lines, are disposed in the array. A row/column line as described herein can include a pass transistor structure comprising a semiconductor strip in a first patterned layer, such as a conductor layer used in the array to form the row/column lines, over the substrate. The semiconductor strip includes a semiconductor channel body, the contact region on one side of the semiconductor channel body, and an extension on another side of the semiconductor channel body, which reaches into the memory cells in the array. A select line in a second patterned layer crossing the semiconductor channel body is provided. A row/column line select signal generator produces a select signal, and is connected to the select line. A row/column line voltage generator produces a row/column line voltage, that is applied to the contact region of the pass transistor structure. Accordingly, the device includes a pass transistor structure that includes a semiconductor channel body within the row/column line, isolated from the substrate. The pass transistor structure can be implemented in a fanout structure for row/column lines in the array.

In embodiments of the technology, the row/column line comprises one of the plurality of local word lines of a block in the array. The pass transistor structures are implemented in a fanout structure for the plurality of local word lines in the block, as part of local word line selection circuitry or drivers.

A memory device is described, that comprises a plurality of blocks of memory cells, where the blocks include respective sets of local word lines. Local word lines in the respective sets include pass transistor structures as described above, including a semiconductor channel body over the substrate, the contact region on one side of the semiconductor channel body, and an extension on another side of the semiconductor channel body which is coupled to memory cells in a corresponding one of the blocks. A plurality of local block select lines is coupled with corresponding blocks in the plurality of blocks. The local block select lines cross the pass transistor semiconductor channel bodies of pass transistor structures in more than one of the local word lines in a given set of local word lines. A plurality of global word lines is provided. A global word line in the plurality is connected to the contact regions of the pass transistor structures in corresponding local word lines in more than one block of the plurality of blocks.

Peripheral circuitry is described as well, for providing select signals, and row/column line voltages, as required for operation of the device.

Manufacturing methods are described as well for including the structures described herein.

Other aspects and advantages of the present invention can be seen on review of the drawings, the detailed description and the claims, which follow.

BRIEF DESCRIPTION OF THE DRAWINGS

FIGS. 10-25 illustrate stages in a manufacturing process which can be utilized to implement an integrated circuit device including a memory with local word line fanout structures with pass transistors.

DETAILED DESCRIPTION

A detailed description of embodiments of the present invention is provided with reference to the FIGS. 1-25.

Figure 1:
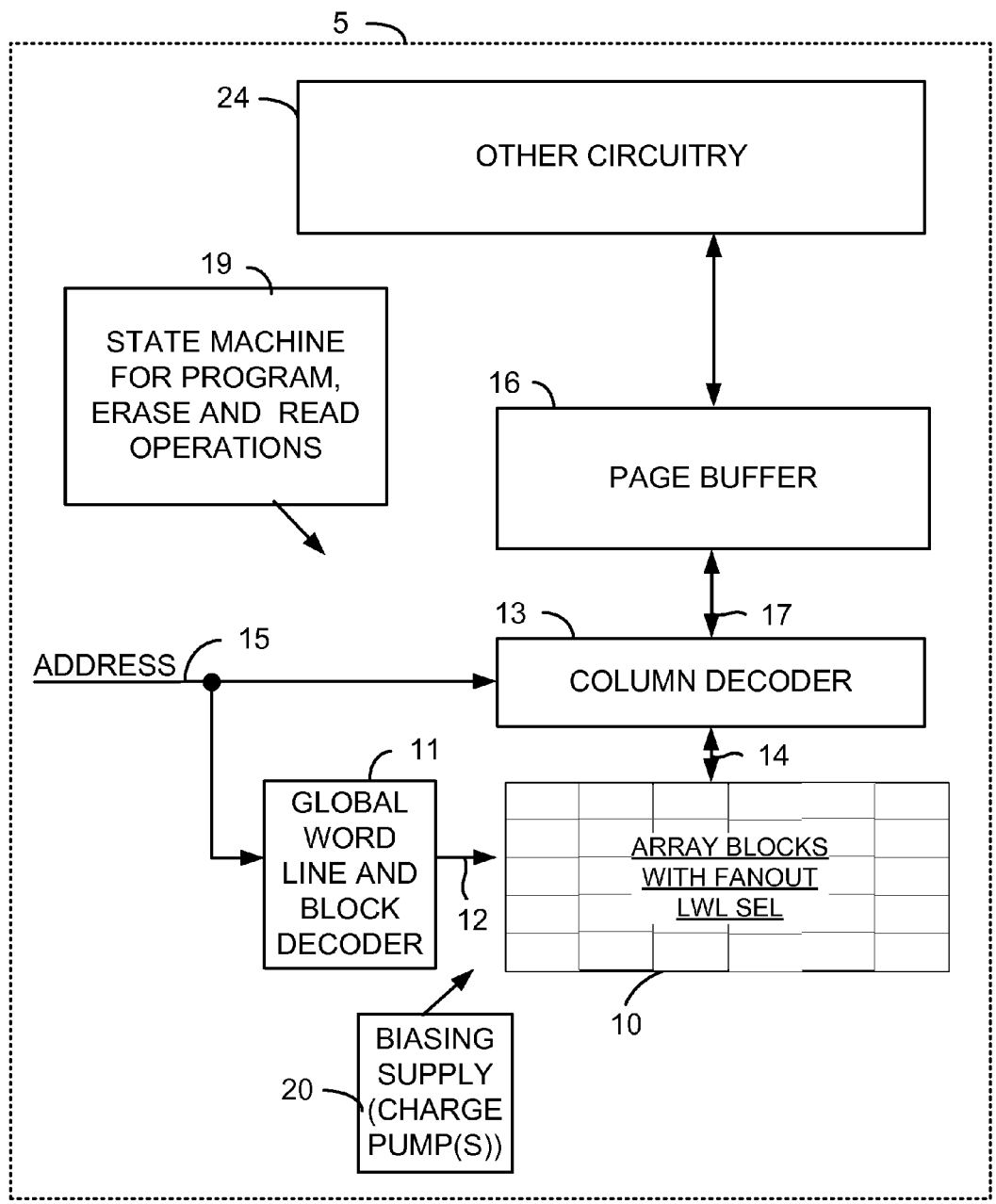
FIG. 1 is a simplified block diagram of an integrated circuit memory including local word line select circuits disposed in the fanout structures.

FIG. 1 is a simplified block diagram of an integrated circuit 5 including a memory array 10 including a plurality of blocks of memory cells, each block including a sub-array of memory cells with local word lines. The blocks in this example include, or are coupled with, local word line select transistors that comprise thin film transistors, the channels of which are part of the layer of material used to form the local wordlines, and in illustrated examples, are disposed in the local word line fanout structure.

A word line and block decoder 11 drive global word lines and block decode lines (collectively, 12), arranged in the memory array 10. The global word lines supply word line voltages to the local word lines in blocks selected by the block decode lines. In embodiments described herein, each block includes circuits to connect the global word lines to corresponding local word lines using pass transistors disposed in the fanout structures of the local word lines.

A column decoder 13 is coupled to a plurality of global bit lines 14 arranged along columns in the memory array 10 for reading data from and writing data to the memory array 10. Addresses are supplied on bus 15 to decoder 11 and decoder 13. Page buffer circuits 16, including one or more buffers and associated circuitry, are coupled to the column decoder 13, in this example via data lines 17.

The page buffer circuits 16 can be coupled to input/output circuits and other data sources internal or external (collectively "other circuitry" 24) to the integrated circuit 5, such as a general purpose processor or special purpose application circuitry, or a combination of modules providing system-on-a-chip functionality supported by the memory array 10.

In the example shown in FIG. 1, control logic 19 controls the application of supply voltages generated or provided through the voltage supply or supplies in block 20, such as read, erase, verify and program bias voltages, including voltages on global word lines, bit lines, block select lines and other bias points used in accessing the memory cells storing data in the array.

Figure 2:
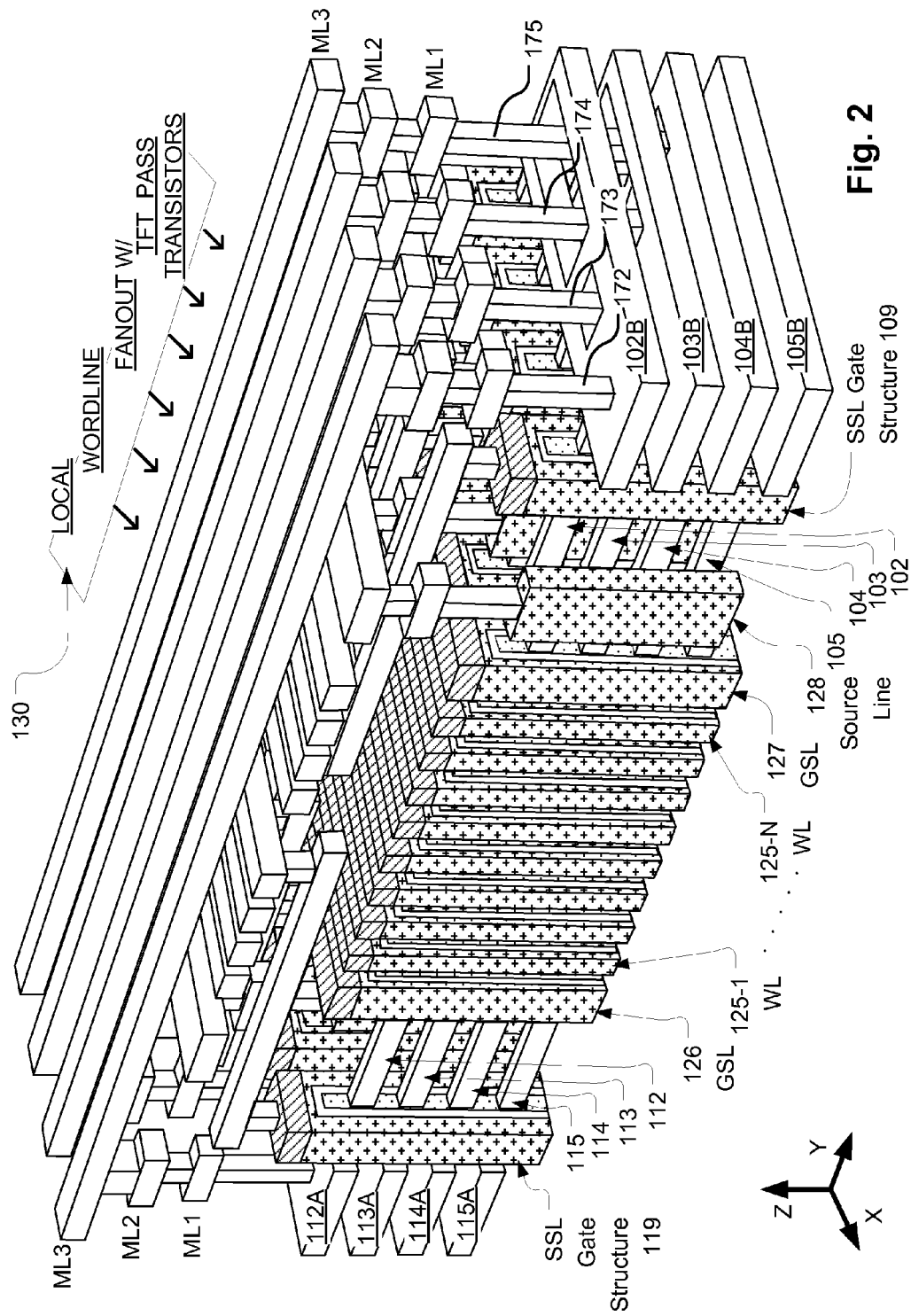
FIG. 2 illustrates a block of memory cells in a 3D vertical gate NAND flash array structure, for which the technology described herein can be applied.

FIG. 2 is a perspective illustration of a block of memory cells of a three-dimensional (3D) integrated circuit device, which provides one example of a block including a sub-array of memory cells of an array (such as array 10 in FIG. 1), and is suitable for use in a product like that represented by FIG. 1.

The device illustrated in FIG. 2 includes a plurality of stacks of active strips acting as channel lines in NAND strings, alternating with insulating strips. Insulating material is removed from the drawing to expose additional structure. For example, insulating strips are removed between the active strips in the stacks, and are removed between the stacks of active strips. This structure is described herein in some detail, as an example of a three-dimensional (3D) memory array which can be manufactured on a semiconductor substrate, in combination with peripheral circuits on the substrate (not shown), including local word line fanout structures (represented by block 130) with embedded, high voltage thin film transistor TFT, pass transistors.

In the example shown in FIG. 2, a multilayer array is formed on an insulating layer, and includes a plurality of local word lines 125-1 WL through 125-N WL conformal with the plurality of stacks. The local word lines extend to a fanout structure 130, at which word line voltages from global word lines are supplied to the corresponding local word lines in the block.

The plurality of stacks includes active strips 112, 113, 114, and 115 in multiple planes. Active strips in the same plane are electrically coupled together by contact pads (e.g. 102B).

A contact structure including a stack of contact pads 112A, 113A, 114A, and 115A terminate active strips, such as the active strips 112, 113, 114, and 115 in the plurality of stacks. As illustrated, these contact pads 112A, 113A, 114A, and 115A are electrically connected to different bit lines for connection to decoding circuitry to select planes within the array. These contact pads 112A, 113A, 114A, and 115A can be patterned at the same time that the plurality of stacks is defined.

A contact structure including a stack of contact pads 102B, 103B, 104B, and 105B terminate active strips, such as active strips 102, 103, 104, and 105. As illustrated, interlayer connectors 172, 173, 174, 175 electrically connect contact pads 102B, 103B, 104B, and 105B to different bit lines in metal layers, such as a metal layer ML3, for connection to decoding circuitry to select planes within the array. The stack of contact pads 102B, 103B, 104B, and 105B can be patterned at the same time that the plurality of stacks is defined.

In this example, any given stack of active strips is coupled to either the stack of contact pads 112A, 113A, 114A, and 115A, or the stack of contact pads 102B, 103B, 104B, and 105B, but not both. The stack of active strips 112, 113, 114, and 115 is terminated at one end by the stack of contact pads 112A, 113A, 114A, and 115A, passes through SSL gate structure 119, ground select line GSL 126, local word lines 125-1 WL through 125-N WL, ground select line GSL 127, and is terminated at the other end by source line 128. The stack of active strips 112, 113, 114, and 115 does not reach the stack of contact pads 102B, 103B, 104B, and 105B.

The stack of active strips 102, 103, 104, and 105 is terminated at one end by the stack of contact pads 102B, 103B, 104B, and 105B, passes through SSL gate structure 109, ground select line GSL 127, local word lines 125-N WL through 125-1 WL, ground select line GSL 126, and is terminated at the other end by a source line (obscured by other parts of the figure). The stack of active strips 102, 103, 104, and 105 does not reach the stack of contact pads 112A, 113A, 114A, and 115A.

A layer of memory material is disposed in interface regions at cross-points between surfaces of the active strips 112-115 and 102-105 and the plurality of local word lines 125-1 WL through 125-N WL. In particular, the layer of memory material is formed on side walls of the active strips in the plurality of stacks. Ground select lines GSL 126 and GSL 127 are conformal with the plurality of stacks, similar to the local word lines.

Every stack of active strips in this example is terminated at one end by contact pads and at the other end by a source line. For example, the stack of active strips 112, 113, 114, and 115 is terminated at one end by contact pads 112A, 113A, 114A, and 115A, and terminated on the other end by a source line 128. At the near end of the figure, every other stack of active strips is terminated by the contact pads 102B, 103B, 104B, and 105B, and every other stack of active strips is terminated by a separate source line. At the far end of the figure, every other stack of active strips is terminated by the contact pads 112A, 113A, 114A, and 115A, and every other stack of active strips is terminated by a separate source line.

Bit lines and string select gate structures are formed at the metals layers ML1, ML2, and ML3. Bit lines are coupled to a plane decoder (not shown). String select gate structures are coupled to a string select line decoder (not shown).

The ground select lines GSL 126 and 127 can be patterned during the same step that the local word lines 125-1 WL through 125-N WL are defined. In some embodiments, a ground select line decoder can include TFT pass transistors embedded in the ground select lines. Ground select devices are formed at cross-points between surfaces of the plurality of stacks and ground select lines GSL 126 and 127. The SSL gate structures 119 and 109 can be patterned during the same step in which the local word lines 125-1 WL through 125-N WL are defined. In some embodiments, the string select line decoder can include TFT pass transistors embedded in the string select lines. String select devices are formed at cross-points between surfaces of the plurality of stacks and string select (SSL) gate structures 119 and 109. These devices are coupled to decoding circuitry for selecting the strings within particular stacks in the array.

Although the sub-array shown in FIG. 2 is representative of a block of flash memory cells in a 3D NAND configuration suitable for use with the technology described herein for connecting global word lines to local word lines, other memory structures can be utilized, including other configurations of 3D vertical gate structures, 3D vertical channel structures, 2D arrays, arrays in NOR configurations, arrays in AND configurations and other memory structures. Also, other memory cell technologies can be utilized, including all types of volatile and nonvolatile memory suitable for arrangement in blocks with local word lines as described herein.

Figure 3:
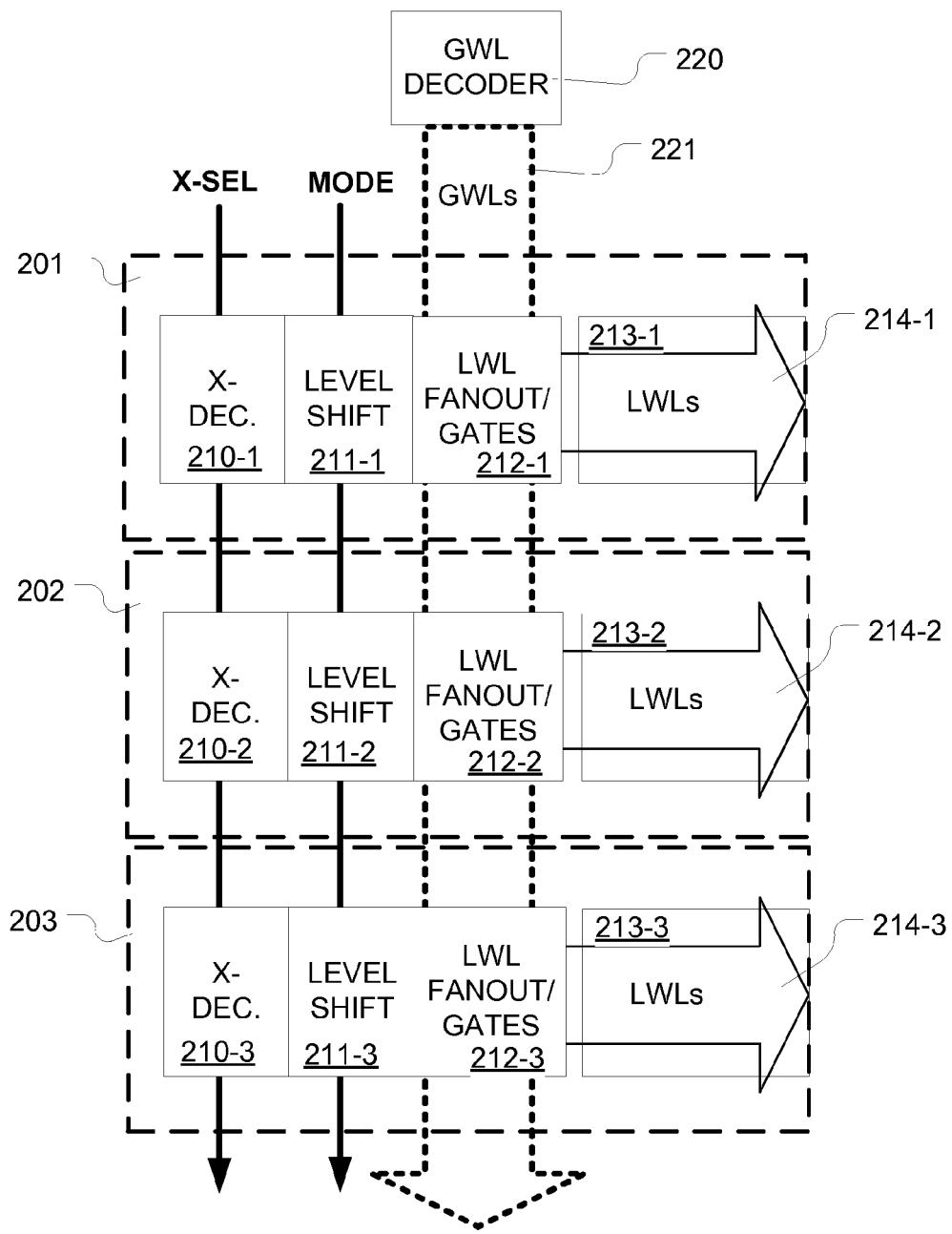
FIG. 3 is a simplified block diagram of a plurality of blocks of a memory cell including local word line fanout structures with pass transistor structures as described herein.

FIG. 3 is a schematic diagram of a plurality of blocks 201-203 in a memory array. Block 201 includes X-DEC circuit 210-1, level shifter 211-1, local word line fanout structure 212-1, including pass transistors, and a set 214-1 of local word lines which extend through a subarray 213-1 of memory cells. Block 202 includes X-DEC circuit 210-2, level shifter 211-2, local word line fanout structure 212-2, including pass transistors, and a set 214-2 of local word lines which extend through a subarray 213-2. Block 203 includes X-DEC circuit 210-3, level shifter 211-3, local word line fanout structure 212-3, including pass transistors, and a set 214-3 of local word lines which extend through a subarray 213-3.

A global word line decoder 220 generates word line voltages for a set of global word lines 221 which extend through the array to the local word line fanout structures 212-1, 212-2, 212-3, in all or some of the blocks in the array. The X-DEC circuits (e.g. 210-3) receive block select signals X-SEL from the block decoder on the integrated circuit, and control enabling the connection of the global word lines to the selected blocks. The level shifters (e.g. 211-3) are used to produce control signals for the pass transistors in the fanout structure, such that the gate voltages on the pass transistors are sufficiently high relative to the word line voltages supplied on the global word lines to turn on the pass transistors in selected blocks.

In some implementations, such as in flash memory, the word line voltages can exceed 20 volts or more during program operations. In such implementations, the level shifters are coupled with charge pumps or other high voltage sources to produce select signals that can be about 5 volts or more higher than the word line voltages, or 25 volts or more. Thus, the pass transistors utilized for the local word lines have breakdown voltages sufficiently high for reliable operation at such high voltages.

Figure 4:
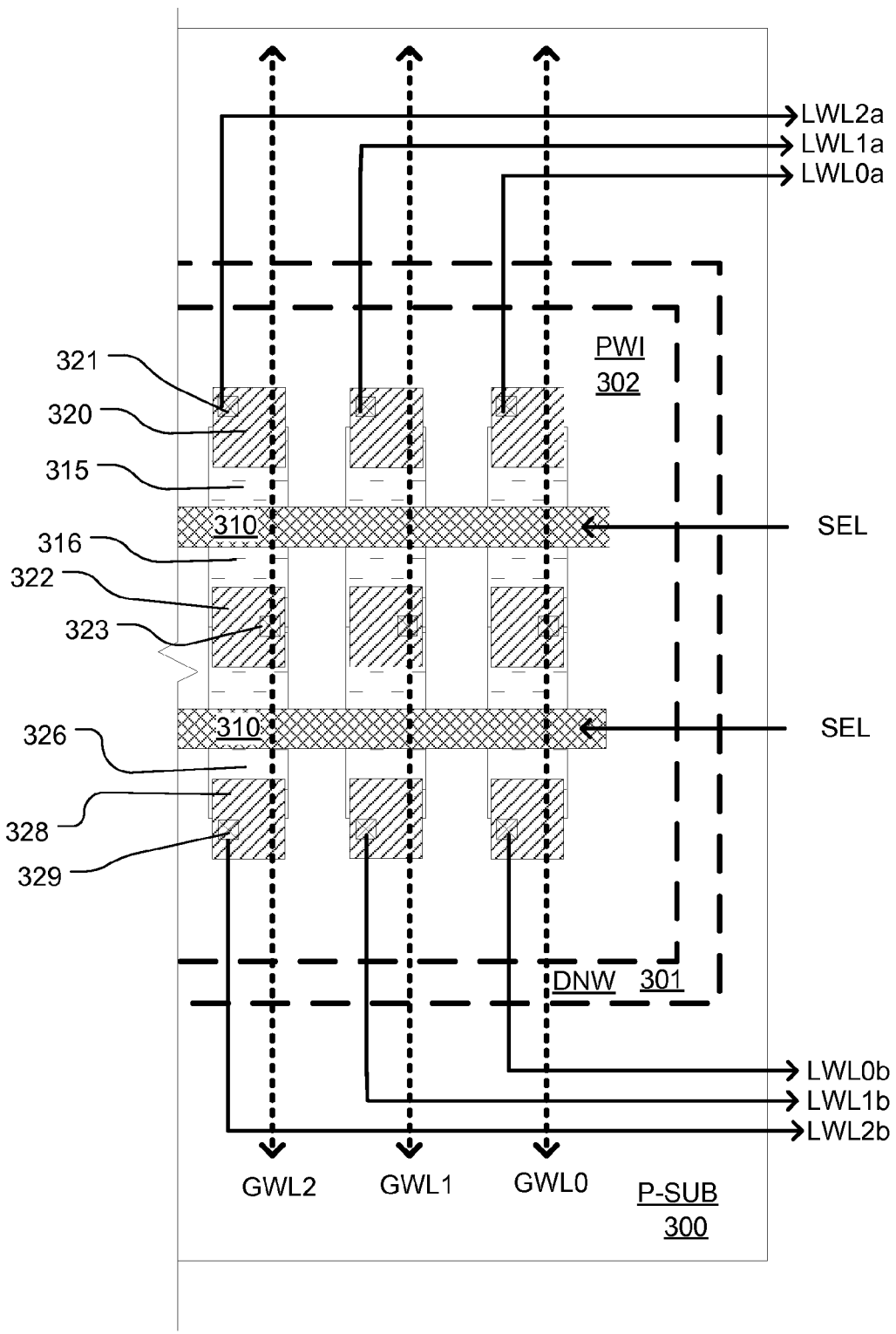
FIG. 4 illustrates the layout of a prior art local word line pass transistor structure for a high density memory.

FIG. 4 illustrates a prior art, pass transistor structure for connecting global word lines to local word lines. In this example, the pass transistors are implemented in a triple well structure to support high voltages and negative voltages applied to local word lines. Thus for example, the pass transistors are implemented in a p-type substrate 300. The deep n-type well 301 is implemented in the substrate 300. An internal p-type well 302 is implemented within the deep n-type well 301. The triple well structure provides isolation of the channel regions of the pass transistors from the grounded substrate.

In this layout, back-to-back pass transistors are formed. The pass transistors have gate conductors 310 connected to a select signal SEL which is generated by the level shifter in the block. Conduction terminals of the pass transistors are implemented using an n-type region (e.g. 315 in the leftmost pass transistor in the figure), n-type region (e.g. 316) and n-type region (e.g. 326). The channel regions of the pass transistors are disposed beneath the gate conductors 310. An interlayer contact 323 connects the region 316 to an overlying conductor 322 shown schematically as a single square, but which extends along the GWL2 line in the figure. An interlayer contact 321, and an interlayer contact 329 connect the regions 315 and 326 respectively to overlying conductors 320 and 328 respectively, shown schematically as single squares, but which extend to local word lines (e.g. LWL2a and LWL2b).

The overlying conductors 322 which comprise the global word lines can be implemented in a patterned conductor layer, such as a metal layer on the device. Also, the overlying conductors 320 and 328 which are connected to local word lines in the block, can be implemented using a patterned conductor layer, such as a metal layer on the device. The metal layers used to form the overlying conductors 322, 320 and 328 can be a single metal layer, or multiple metal layers as suits a particular arrangement of the device. Likewise, the conductors 310 can comprise a polysilicon/silicide conductor line beneath the metal layers in some embodiments. In other embodiments, the conductors 310 can be implemented using metal or other patterned conductor layers.

The channel width and channel lengths of the pass transistors are selected to support high conductivity with high voltages. Thus, they are required to have significant widths and lengths, as compared to logic transistors and memory cells on the device.

Figure 5:
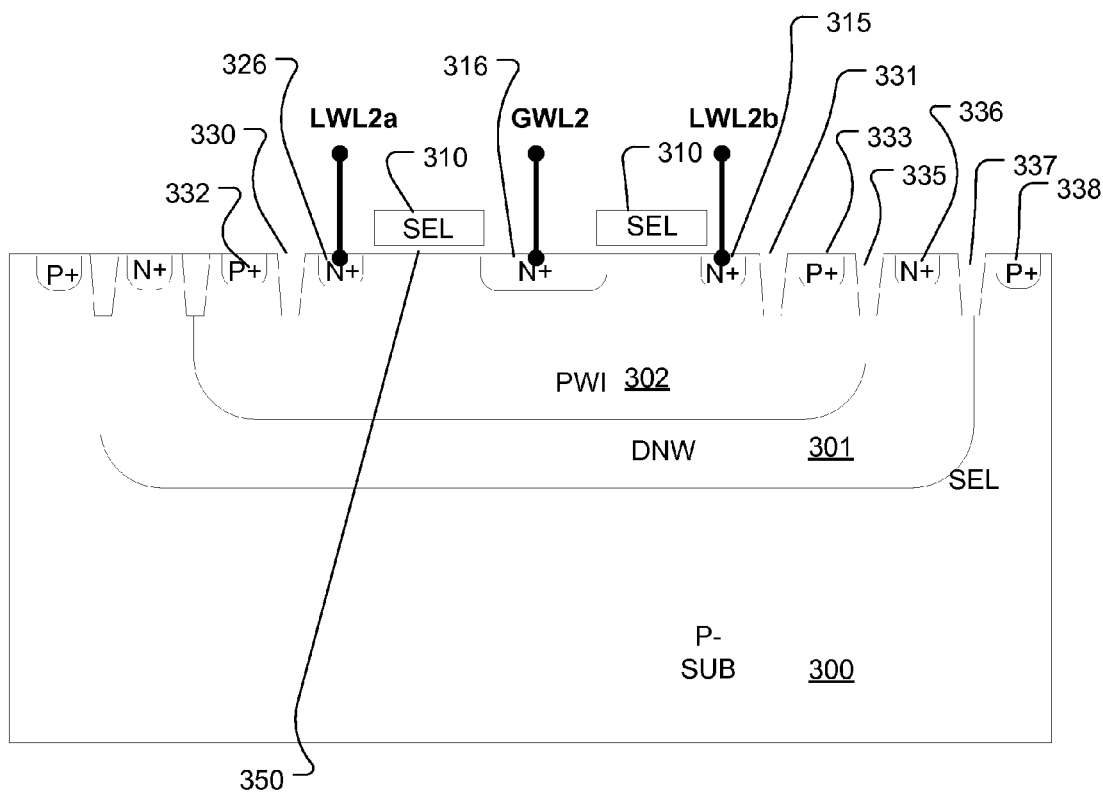
FIG. 5 illustrates a prior art triple well structure utilized for local word line pass transistor structures like those of FIG. 4 for a high density memory.

FIG. 5 illustrates the triple well structure of the prior art pass transistor like that of FIG. 4. As can be seen, the triple well is disposed in a p-type substrate 300. A deep n-type well 301 is disposed in the substrate 300. An internal p-type well 302 is disposed in the n-type well 301. The pass transistors have gate conductors 310 connected to a select signal SEL overlying a channel region in the internal p-type well, and separated from it by a gate dielectric layer 350. The global word lines, e.g. GWL2, are coupled to the n-type region 316. The local word lines, e.g. LWL2a, LWL2b, are coupled to the n-type regions 326, 315. Isolation structures, such as shallow trench isolation structures 330, 331 are formed adjacent and surrounding the pass transistors inside the p-type well 302. P-type pickup contacts 332 and 333 are formed in the p-type well 302. N-type pickup contacts (e.g. 336) are formed in the deep n-type well 301. Likewise, P-type pickup contacts, e.g. 338, are formed in the substrate 300. Shallow trench isolation structures 335 and 337 are used to isolate the pickup contacts.

The prior art pass transistor structure illustrated in FIGS. 4 and 5 can consume significant space on the integrated circuit because of the requirement for large triple well transistors suitable to support high voltages and negative voltages needed on word lines. As the number of blocks in an array increases, the overhead associated with these pass transistor structures also increases. It is desirable to conserve layout space in high density integrated circuits as much as possible.

Figure 6:
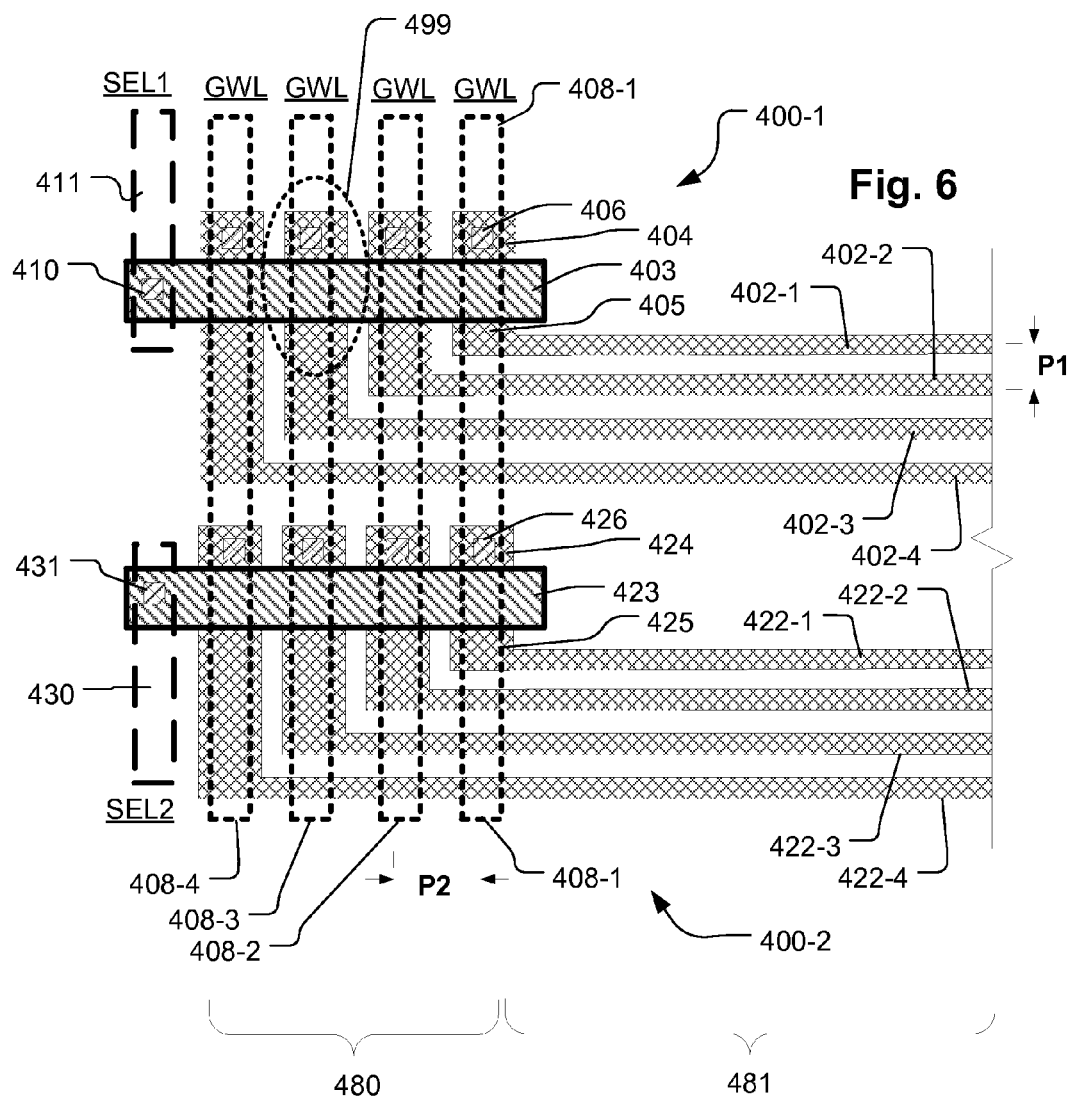
FIG. 6 illustrates the fanout structures of two sets of local word lines for a high density memory, including pass transistor structures as described herein.

FIG. 6 is a layout diagram showing sets 400-1 and 400-2 of local word lines which are part of corresponding blocks of memory cells in an array that includes a plurality of such blocks.

In the examples described herein, the pass transistor structures are implemented in local word line strips. The same pass transistor structure can be applied in a word line utilized for a ground select line or for a string select line in a NAND flash memory. Also, the pass transistor structure can be utilized for other types of decoder, including for example column decoders utilized for bit lines. Collectively, the local word lines, string select lines, ground select lines and bit lines are referred to herein as row/column lines, utilized for access to memory cells in the array.

The local word lines in the sets 400-1 and 400-2 include respective pass transistor structures (e.g. in region 499). The set 400-1 includes local word lines 402-1, 402-2, 402-3 and 402-4 in this example. The set 400-2 includes local word lines 422-1, 422-2, 422-3 and 422-4 in this example. In other implementations, there may be a large number of local word lines in each set, such as 64 local word lines or more.

The gates for the pass transistor structures in the corresponding blocks are provided by select lines 403 and 423 respectively, which can be connected to the outputs of level shifters in a system like that of FIG. 3. In this example, the select lines 403 and 423 are formed in a patterned conductor layer that overlies the local word lines, and is separated from the local word lines by a gate dielectric layer configured for high voltage gate voltages. Interlayer contacts 410, 431 connect the select lines 403, 423 to overlying patterned conductor lines 411, 430, respectively, which are in turn routed in an appropriate pattern, to the sources of the select signals SEL1 and SEL2 for the respective blocks.

A pass transistor structure in a local word line includes a semiconductor channel body over the substrate (beneath the select lines 403, 423), and insulated from the substrate by a layer of dielectric for example, resulting in a thin film transistor TFT.

In this manner, the channel of the pass transistor is not part of the semiconductor substrate, and need not rely on a triple well structure for isolation. The pass transistor structures in the local word lines also include a contact region (e.g. 404) which can include a source/drain terminal on one side of the semiconductor channel body and an extension which can include a source/drain terminal (e.g. in region 405) on another side of the semiconductor channel body. The extensions of the local word lines (e.g. 402-1) are coupled to memory cells in the corresponding blocks.

An interlayer connector 406 in the contact region 404 of the pass transistor structure connects to an overlying patterned conductor line 408-1 which acts as a global word line structure. Likewise, interlayer connector 426 in the contact region 424 of the pass transistor structure on the word line 422-1 connects to the same overlying patterned conductor line 408-1, and thereby the blocks include respective local word lines coupled via the pass transistor structure with, and corresponding to, each global word line. A similar pattern of connection is applied to each of the global word lines 408-2 through 408-4. As a result, a pattern of word line voltages (e.g. a pattern of pass voltages and program voltages produced in an incremental stepped pulse program ISPP operation) applied to the global word lines, can be connected to the local word lines in selected blocks, using the pass transistor structures.

Patterned conductor lines (e.g. 408-1) utilized as global word lines can be implemented in a patterned metal layer, or other patterned conductor layer. The patterned conductor layer utilized for the global word lines can be the same layer as utilized for the select lines 403, 423. In other embodiments, the select lines 403, 423 can be implemented in a first metal layer, while the global word lines are implemented in a second or higher metal layer. The selection of the patterned conductor layers utilized for the various components can be made based on the requirements of a particular implementation.

FIG. 6 illustrates fanout structures for the local word lines in the blocks. The local word lines in the illustrated fanout structures have an elbow region (generally 480) connecting a vertical segment that includes the pass transistor structures extending in the vertical direction, and a horizontal segment (generally 481) that includes portions of the local word line extending in the horizontal direction in this illustration. The horizontal segments extend from the memory cells to a region beneath the corresponding global word line (e.g. 408-2), such that the terminations of the horizontal segments are offset horizontally in a step fashion as shown. Likewise, the vertical segments extend from the horizontal segments to the contact regions of the corresponding pass transistor structures. In this illustration, the contact regions are aligned horizontally, so that the terminations of the vertical segments are likewise aligned.

Fanout structures in this example are configured so that the extensions in region 481 of the local word lines extending to the memory cells have a first vertical pitch P1 (distance from the center of one local word line to the center of an adjacent local word line), while the portions in region 480 of the local word lines having the semiconductor channel body and the contact region extend orthogonally, and have a second horizontal pitch P2, where the horizontal pitch P2 is significantly greater than the vertical pitch P1. This enables high density structures in the memory cells, while providing area for the pass transistor structures and contact regions to support interlayer connectors and the like.

The extensions in the region 481 of the local word lines extending to the memory cells are implemented utilizing the same material as utilized in the fanout structure, which in this example comprises doped polysilicon. As illustrated in the manufacturing process description below, a silicide layer can be formed over a top surface of the polysilicon layer to improve conductivity. In an alternative, the extensions in the region 481 can be implemented using a different material, such as a high work function gate material or metal that may be different from the material required for the semiconductor channel body of the pass transistor structure.

In general, a fanout structure as the term is used herein, comprises a layout configuration of portions of a set of local word lines, or other row/column lines, adapted to support the formation of interlayer contacts to, for example, global word lines. For local word line structures, layout configuration of the fanout structure is adapted to support formation of interlayer contacts between the local word lines and corresponding global word lines. A fanout structure can have the configuration illustrated in FIG. 6 when for example the local word lines have a small pitch inside the array, and a larger pitch in the region for making interlayer contacts to overlying global word lines that are arranged orthogonally relative to the local word lines in region 481. In the technology described herein, the pitch of the semiconductor channel bodies in the fanout structure can be larger than the pitch of the local word lines as well.

The pass transistor structures illustrated in FIG. 6 are disposed in the fanout structure, and can replace the triple well structure shown in FIGS. 4 and 5, and substantially reduce the area in the layout required for implementation of the pass transistors.

Figure 7:
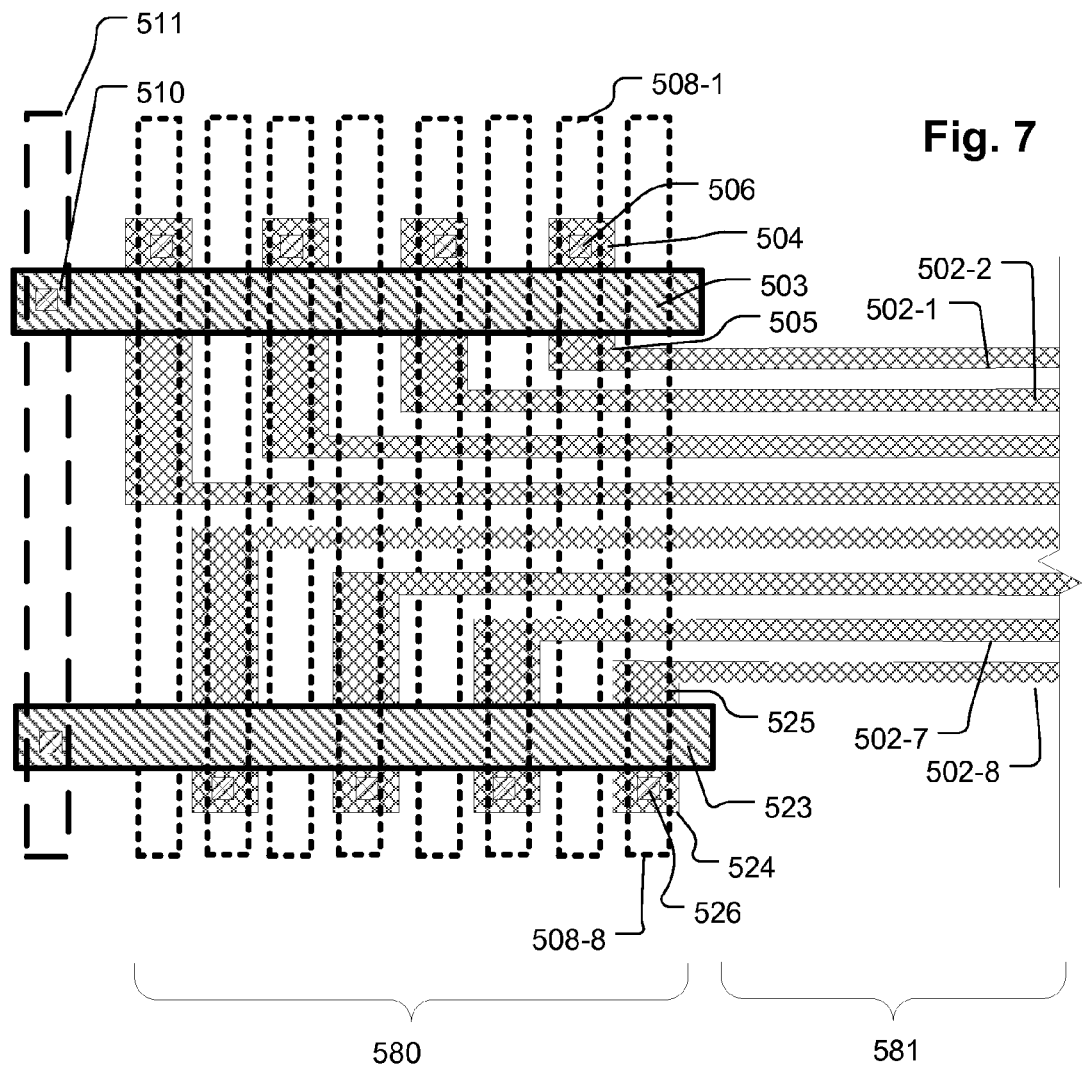
FIG. 7 illustrates an alternative fanout structure for local word lines in a high density memory, including pass transistor structures as described herein.

FIG. 7 illustrates an alternative layout configuration of a fanout structure for a block of memory cells. A set of local word lines 502-1 through 502-8 is illustrated. The local word lines include extensions in the region 581 into the memory cells with a relatively small vertical pitch. The local word lines include elbow portions in the region 580 with vertical segments that include the pass transistor structures, and have a relatively larger horizontal pitch. In this illustration, there are eight local word lines in the set for a single block. In some embodiments, there can be many more local word lines in a single block, including for example 64 local word lines or more.

The gates for the pass transistor structures are provided by the select lines 503, 523, both of which are coupled to the same overlying conductor 511 by interlayer connectors (e.g. 510). In this manner, all of the pass transistor structures for this block are controlled by the same select line. The select line can be connected to a level shifter or other source of a select line voltage as described above.

A pass transistor structure in the local word line includes a semiconductor channel body over the substrate, and beneath the corresponding select lines 503, 523. The semiconductor channel body is insulated from the substrate by a dielectric layer for example, resulting in a thin film transistor TFT. The pass transistor structures in the local word lines also include corresponding contact regions (e.g. 504, 524) which can include a source/drain terminal on one side of the semiconductor channel body, and an extension which can include a source/drain terminal (e.g. in region 505, 525) on another side of the semiconductor channel body. Extensions of the local word lines (e.g. 502-1) are coupled to memory cells in the corresponding blocks.

Interlayer connector 506, in the contact region 504 of the pass transistor structure on local word line 502-1, connects to an overlying patterned conductor line 508-1, which acts as a global word line. Likewise, interlayer connector 526, in the contact region 524 of the pass transistor structure on local word line 502-8, connects to an overlying patterned conductor line 508-8, which acts as a global word line. As illustrated, the vertical segment of local word line 502-1 is offset horizontally from the vertical segment of local word line 502-8 to accommodate parallel patterned conductor lines 508-1 and 508-8. Also, the vertical segment of the local word line 502-1 extends upwardly in this illustration, while the vertical segment of the local word line 502-8 extends downwardly. A similar pattern is repeated throughout the fanout structure in this example.

Examples of fanout structures in FIGS. 6 and 7 are representative of a variety of layout configurations that can be utilized, and selected according to the layout requirements for interlayer connections and for high voltage pass transistor specifications, of a particular device being implemented.

Figure 8:
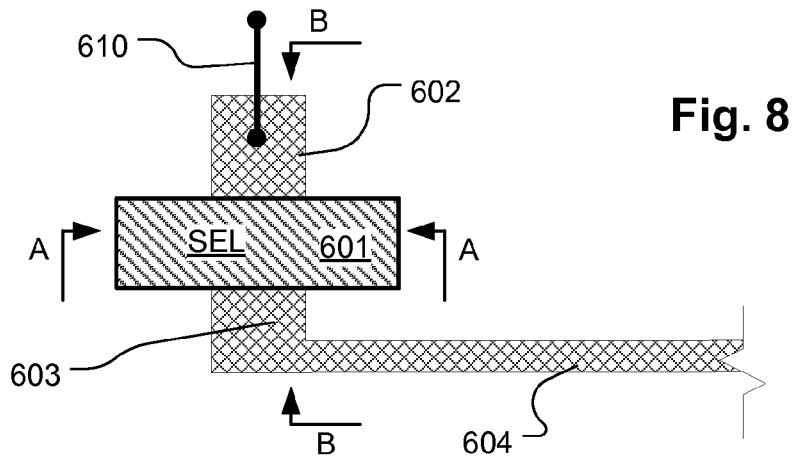
FIGS. 8, 8A and 8B illustrate layout and cross-sectional views of a thin film transistor implemented as part of a local word line in a fanout structure.
Figure 8A:
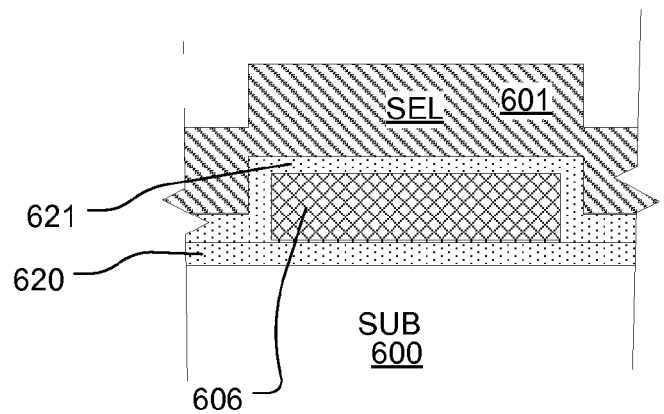
Figure 8B:
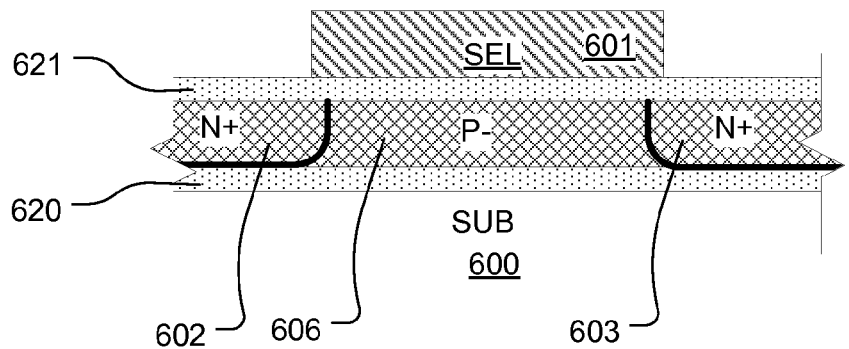

FIGS. 8, 8A and 8B illustrate features of a thin film pass transistor having a semiconductor channel body in a local word line structure such as those discussed above in connection with FIGS. 6 and 7. Reference numerals used in FIGS. 8, 8A and 8B are consistently applied. A layout view shown in FIG. 8 illustrates a local word line that comprises a patterned semiconductor strip on a substrate. The patterned semiconductor strip includes a contact region 602, a semiconductor channel body beneath a select line 601, and an extension including a source/drain region 603 and a horizontal segment 604 which extends into the memory cells in the block. The contact region 602 is connected to a global word line 610 in this simplified illustration. Thus, the pass transistor structure is utilized to connect a global word line through the semiconductor channel body of the local word line into the segment 604 which extends into the memory cells.

FIG. 8A is a cross-sectional view taken on line A-A of FIG. 8. The semiconductor strip of the local word line includes a channel body region 606 separated from an underlying substrate 600 by insulating layer 620 in this example, and separated from an overlying select line 601 by a gate dielectric layer 621. The overlying select line 601 can be implemented using doped polysilicon, metal, or other conductor structures suitable for use as gates on the pass transistors. The substrate 600 can be a semiconductor substrate, or other type of substrate on which the integrated circuit memory device is implemented.

FIG. 8B is a cross-sectional view taken on line B-B of FIG. 8. The semiconductor strip of the local word line includes the channel body region 606, which in this example is a lightly doped p-type region. In other examples, the channel body region can be undoped or have other doping configurations as suits a particular design of the pass transistor channel. The semiconductor strip also includes a contact region 602 which has a high concentration of n-type dopants (N+) provided for high conductivity and to act as a source/drain region for the pass transistor. The semiconductor strip also includes source/drain region 603 which has a high concentration of n-type dopants (N+) provided for high conductivity and to act as a source/drain region for the pass transistor. The region 603 is also coupled to the segment of the local word line which extends into the memory array.

The example pass transistor shown in FIGS. 8, 8A and 8B is an n-channel device. In other embodiments, a p-channel device can be implemented.

FIG. 8 shows a word line (which can be a local word line), including a pass transistor structure comprising a semiconductor strip in a first patterned layer over the substrate 600. The semiconductor strip includes a semiconductor channel body region 606 beneath the select line 601, the contact region on one side of the semiconductor channel body, and an extension on another side of the semiconductor channel body which is coupled to memory cells in the array. Utilization of a pass transistor structure as part of a word line enables compact layout of a memory device while supporting high-speed, high-voltage operation.

Figure 9:
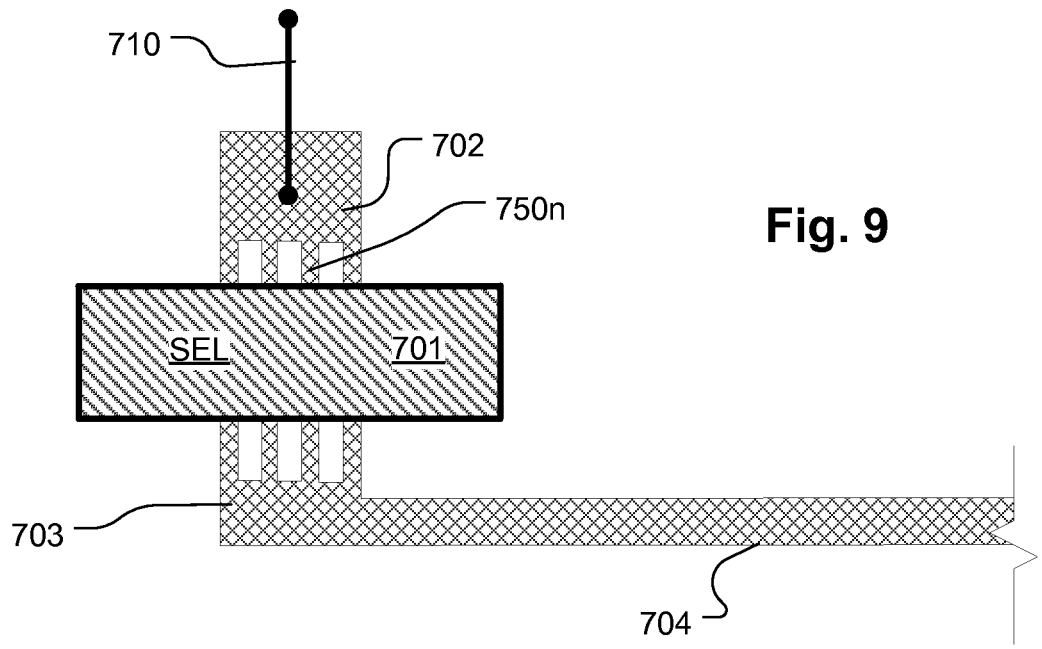
FIGS. 9 and 9A illustrate a layout and a cross-sectional view of a thin film transistor including multiple stripes in that semiconductor channel body, implemented as part of a local word line in a fanout structure.
Figure 9A:
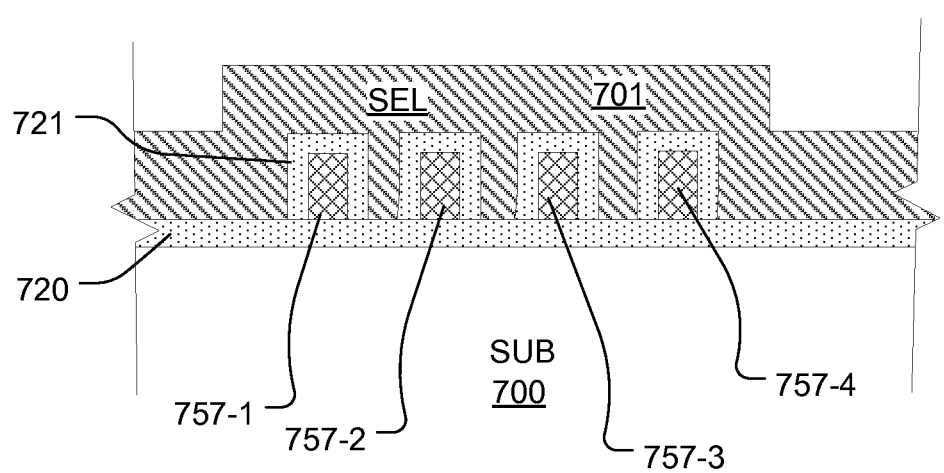

FIGS. 9 and 9A illustrate features of an alternative thin film pass transistor structure having a striped layout, which results in an ultrathin semiconductor channel body structure. The striped layout illustrated can provide a thin film transistor device that has improved mobility, improved sub-threshold swing, and lower body effect.

Reference numerals used in FIGS. 9 and 9A are consistently applied. The layout view shown in FIG. 9 illustrates a local word line that comprises a patterned semiconductor strip on a substrate. The patterned semiconductor strip includes a contact region 702 including a source/drain region, a striped semiconductor channel body including stripes (e.g. 750*n*), beneath a select gate 701. The patterned semiconductor strip also includes an extension including a source/drain region 703 which can overlap with the stripes, and a horizontal segment 704 which is coupled with memory cells in the block. The contact region 702 is connected to a global word line 710 in the simplified illustration. Thus, the pass transistor structure, including a striped semiconductor channel body, is utilized for connecting a voltage provided via a global word line through the semiconductor channel body of the local word line into the segment 704 which extends into the memory cells.

FIG. 9A is a cross-sectional view taken on the line A-A of FIG. 9. The semiconductor strip includes stripes 757-1 through 757-4 in the semiconductor channel body of the pass transistor structure. In this example, four stripes are illustrated. In other examples, a smaller or larger number of stripes can be utilized as suits a particular implementation.

The gate dielectric layer 721 is conformal with the stripes. Likewise, the select gate 701 overlies and is conformal with the gate dielectric layer establishing multiple fin-like, parallel channel bodies, so that a striped channel pass transistor structure is implemented. The stripes 757-1 through 757-4 in the semiconductor strip are isolated from the underlying substrate 700 by dielectric layer 720. Thus, as described above, the pass transistor can be implemented as part of local word line structure without requirement of a triple well structure or other large area isolation device.

FIGS. 10-25 illustrate a representative manufacturing process which can be applied to form local word lines including pass transistors in the fanout regions.

Figure 10:
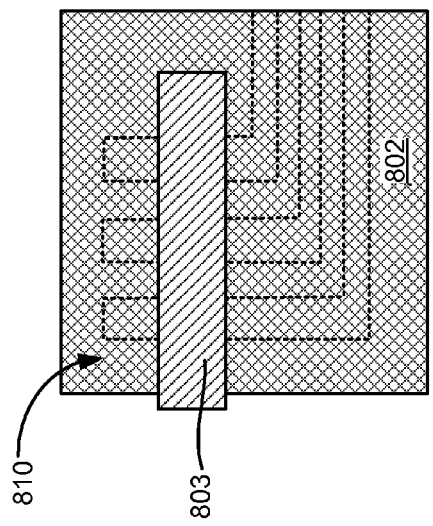
Figure 11:
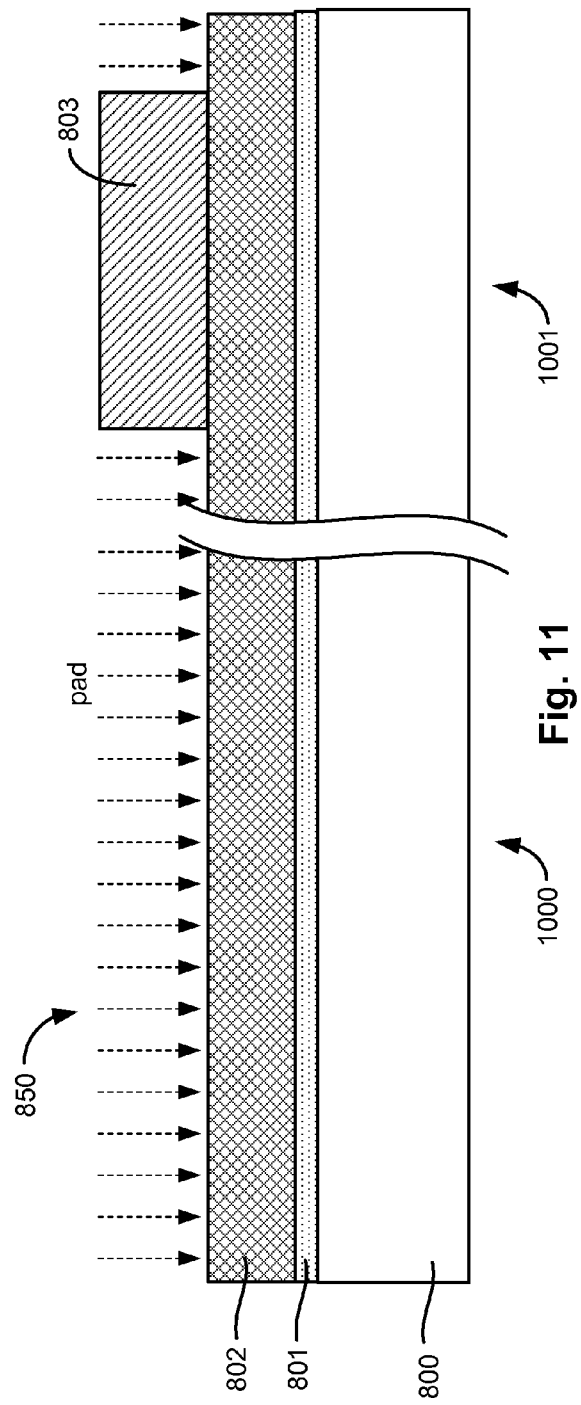

FIG. 10 is a simplified layout illustrating a photoresist mask pattern, and FIG. 11 is a simplified cross-section illustrating a stage in a process applied using the mask pattern. In FIG. 11, a semiconductor substrate 800 is illustrated, having an insulating layer 801 formed thereon. The substrate includes a region 1000 in which peripheral circuits are implemented, and a region 1001 in which memory cells are implemented. A polysilicon layer 802 is formed in a blanket deposition over both regions 1000 and 1001 of the device. In one example, the polysilicon layer 802 can be a layer formed by a second polysilicon deposition (or one of a plurality), where a first polysilicon deposition may be utilized to form floating gate elements in a memory array, or other features on the device.

An implant mask 803, implemented using photoresist in this example is formed over the polysilicon layer 802, and used to protect the semiconductor channel bodies of pass transistors in the fanout structures from the implant illustrated in FIG. 11.

FIG. 10 illustrates in ghost form the layout pattern 810 for a fanout structure to be implemented using the blanket polysilicon layer, and the location of the implant mask 803 over the semiconductor channel bodies in the vertical segments in the fanout structure. As shown in FIG. 11, an implant 850 of n-type to form N+ regions, or p-type impurities to form P+ regions, is executed to establish gate resistance for peripheral circuits, and local word line resistance in the memory region. The doping characteristic in the semiconductor channel body can be the same as that established intrinsically by the deposition process. Alternatively, another doping process can be implemented to adjust the channel doping if necessary.

FIGS. 12 and 13 illustrate layout and cross-section views of the structure in a stage in the manufacturing process after formation of a hard mask layer 825 of silicon dioxide, or other hard mask material, and a patterned etch of the polysilicon layer 802. As illustrated, in the peripheral region 1000, transistor structures including gates 820 and 821 can be formed over active regions (e.g. 841). FIG. 12 illustrates locations (e.g. 844, 840, 842) of contact regions and the like as well in the layout of the peripheral devices, which of course are formed later or earlier in the process. In the array region 1001, a portion of the fanout structure is illustrated including vertical segments 822, 823 and 824 of local word line strips.

A cross-section shown in FIG. 13 shows isolation structures 831, 832, 833, such as shallow trench isolation elements, which can be formed in the peripheral region to isolate the active regions of circuitry. In the array region, the vertical segments 822, 823 and 824 of local word line strips are isolated from the substrate 800 by insulating layer 801.

FIG. 14 illustrates a stage in the process after forming spacers (e.g. 849) on the sidewalls of the patterned features of the polysilicon layer, and depositing an etch stop layer 848, utilizing silicon nitride or other suitable material, to assist stopping an etch process described later. As illustrated, the process used to form spacers 849 in the peripheral region may completely fill the spacing between the vertical segments 822, 823 and 824 of local word line strips in the local word line pass transistor structures.

FIG. 15 illustrates a stage in the process after depositing an interlayer dielectric material 851, and then applying a chemical mechanical polishing process or other planarizing process which stops on the layer 848.

Figure 16:
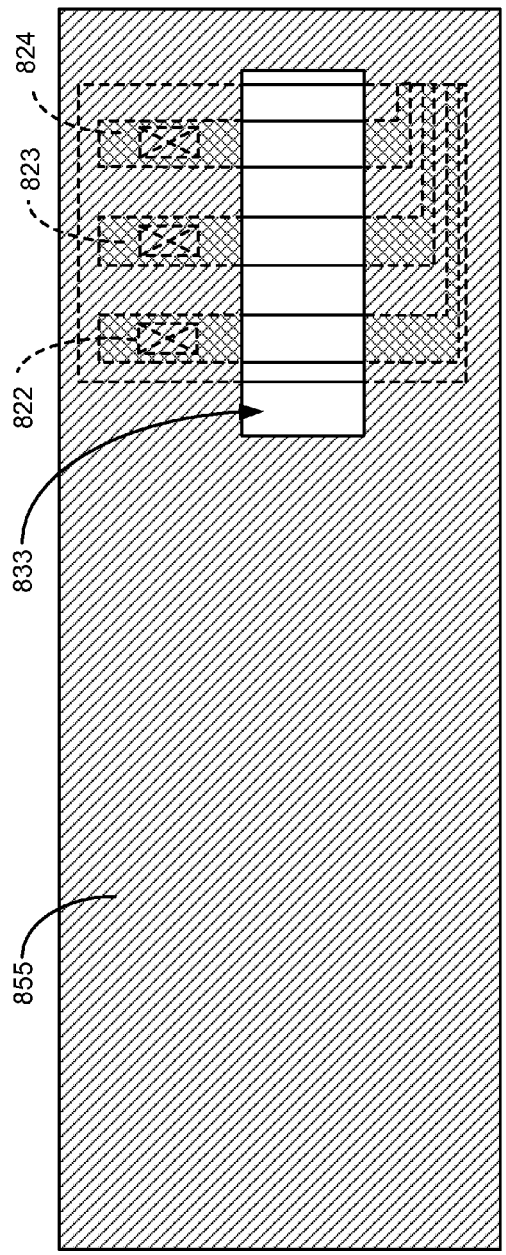
Figure 17:
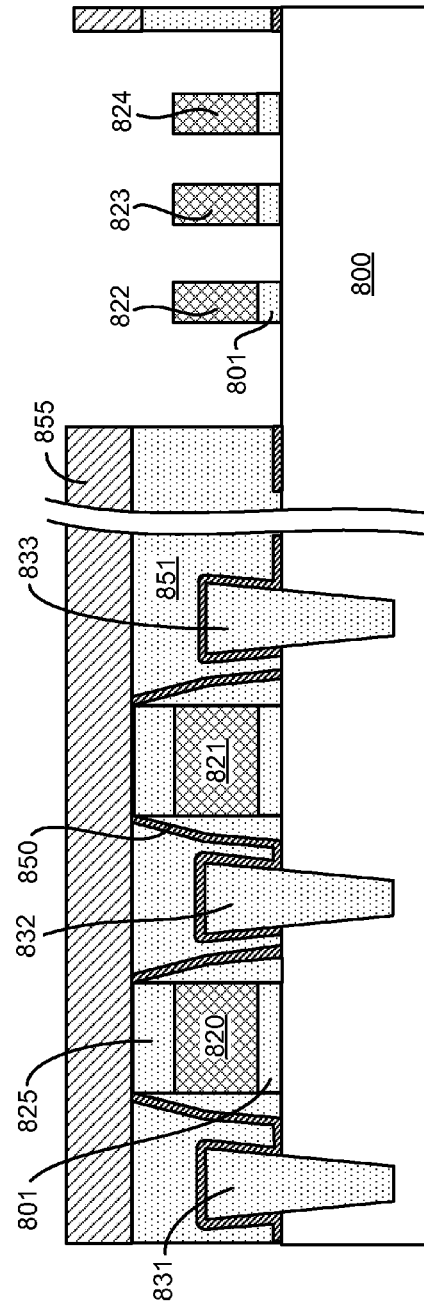

FIGS. 16 and 17 illustrate a mask used to form the select gate element for the pass transistor structures in the local word lines. FIG. 16, including the layout of the mask 855, shows that the peripheral circuits and the memory element circuits are covered, with an opening 833 in the area for the select gate over the vertical segments 822, 823 and 824 of local word line strips. FIG. 17 illustrates the structure after applying an etch process utilizing the mask 855 to remove the interlayer dielectrics and other materials, exposing the segments 822, 823, 824.

Figure 18:
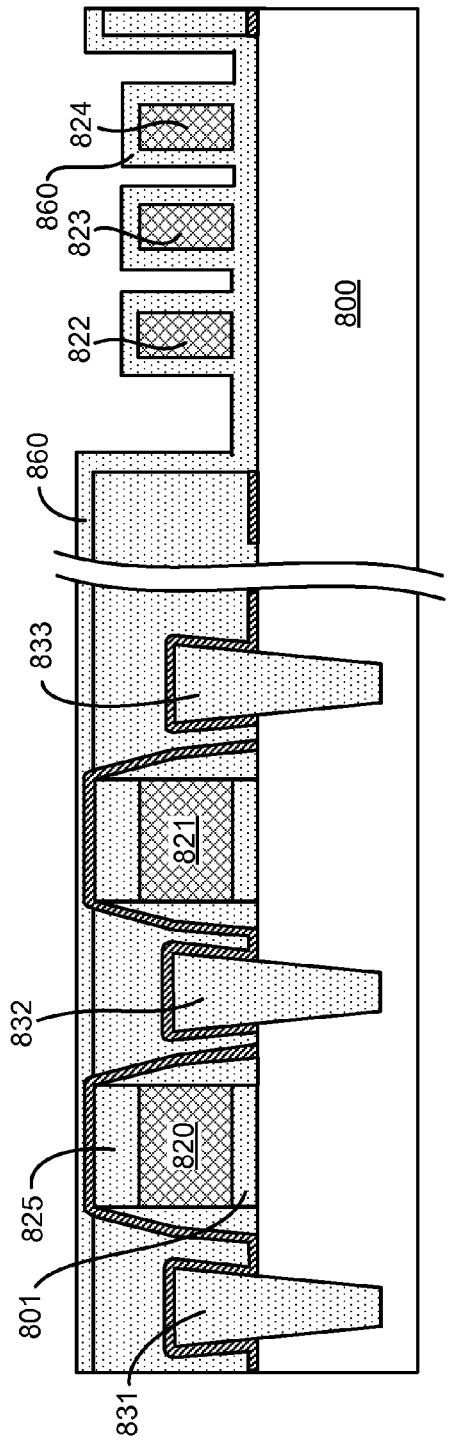

FIG. 18 illustrates the structure in a stage after deposition of the gate dielectric layer 860, such as silicon dioxide formed by chemical vapor deposition, or other deposition process, to be utilized with the pass transistor structures over the segments 822, 823, 824.

Figure 19:
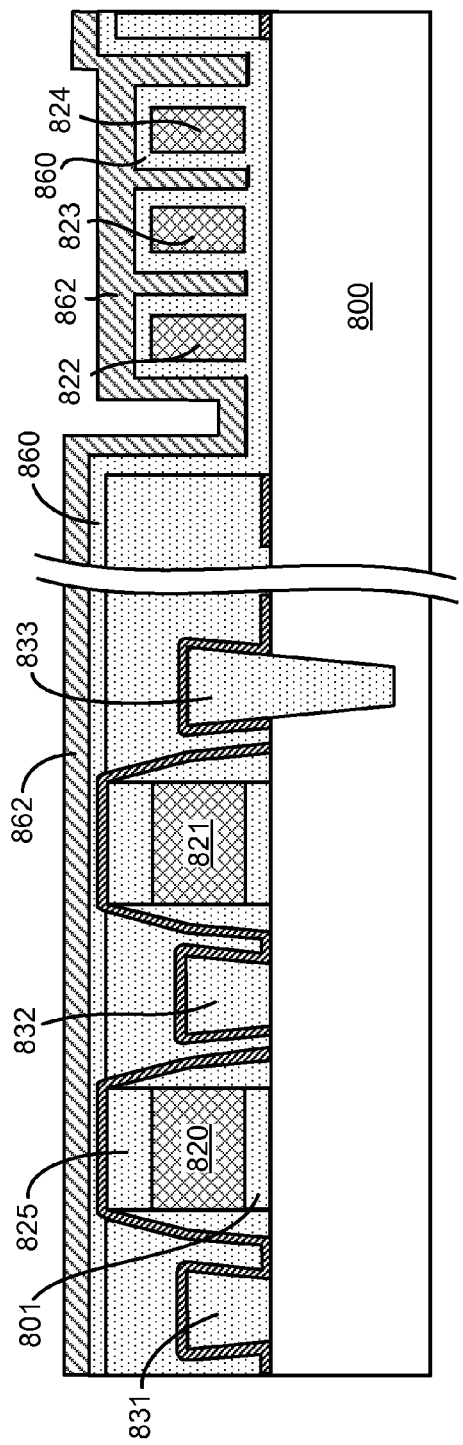

FIG. 19 illustrates the structure after a blanket deposition of a layer 862 of polysilicon or other conductor material, to be utilized as the select gate structure for the pass transistor structures on the vertical segments 822, 823 and 824 of local word line strips.

Figure 20:
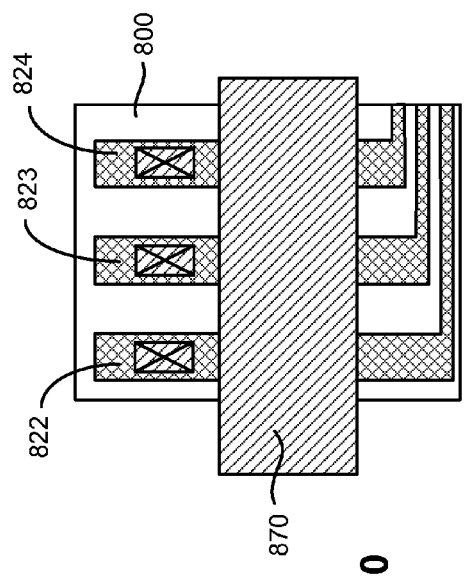
Figure 21:
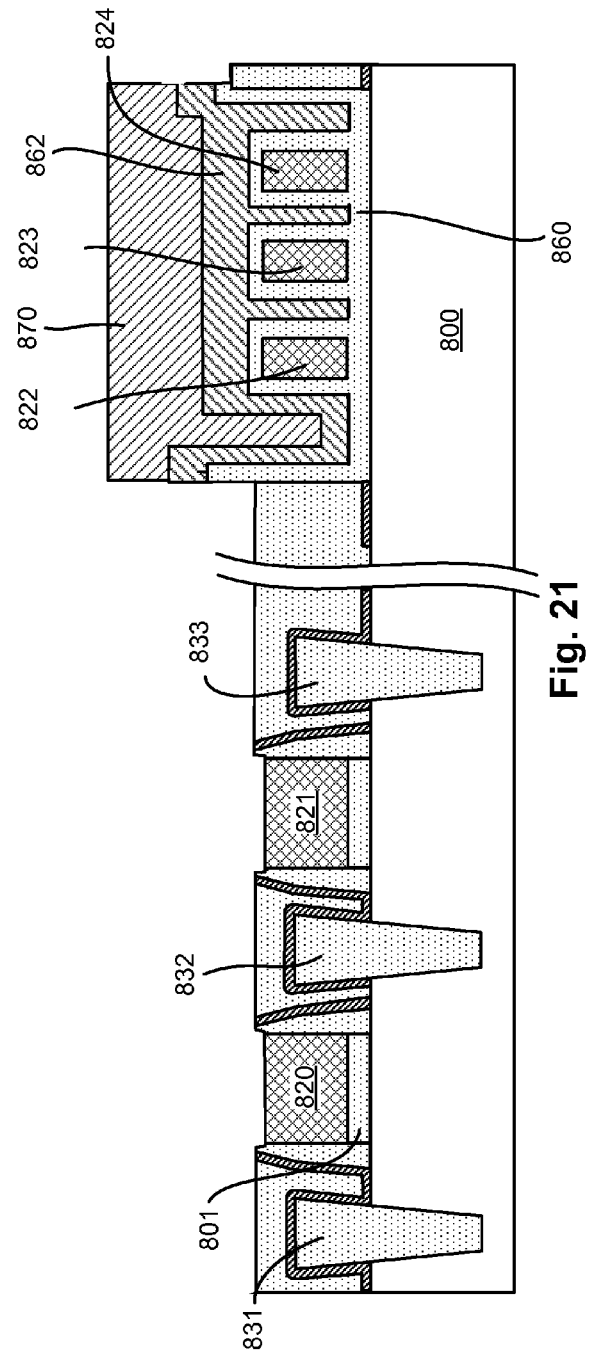

FIGS. 20 and 21 illustrate a mask layout and cross-section of the structure after applying a mask and etch process to define the select gate structures. As can be seen, a mask 870 is defined overlying the semiconductor channel bodies on the segments 822, 823, 824. The width of the mask 870 can be chosen to accommodate any potential misalignment error between the mask 803 utilized in the implant step, and the area of the select gate defined by the mask 870.

As illustrated in FIG. 21, the etch process can remove the conductive layer 862 and other materials overlying the gates 820, 821 of devices in the peripheral region, exposing the top surfaces of the gates for subsequent processing.

Figure 22:
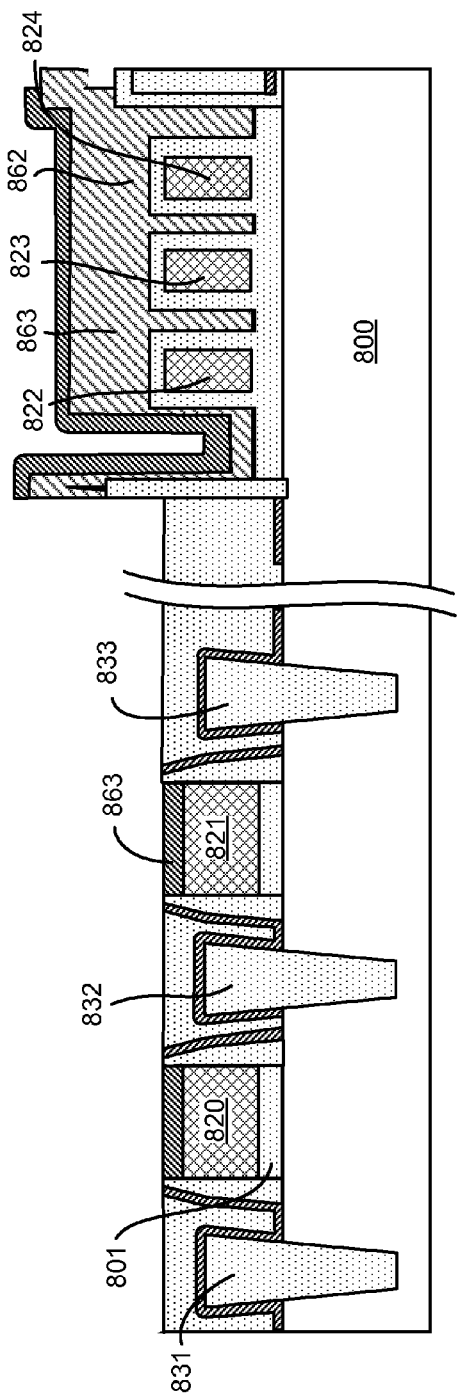

FIG. 22 illustrates the structure after a process removing the mask 870, applying a silicide precursor such as cobalt or tungsten, and annealing the structure to form silicide layer 863 overlying the exposed polysilicon on the gates 820, 821 in the peripheral region, and the select gate structure (remaining from layer 862) over the local word line segments 822, 823, 824. An additional step can be utilized to remove the silicide precursor from other regions on the device.

Figure 23:
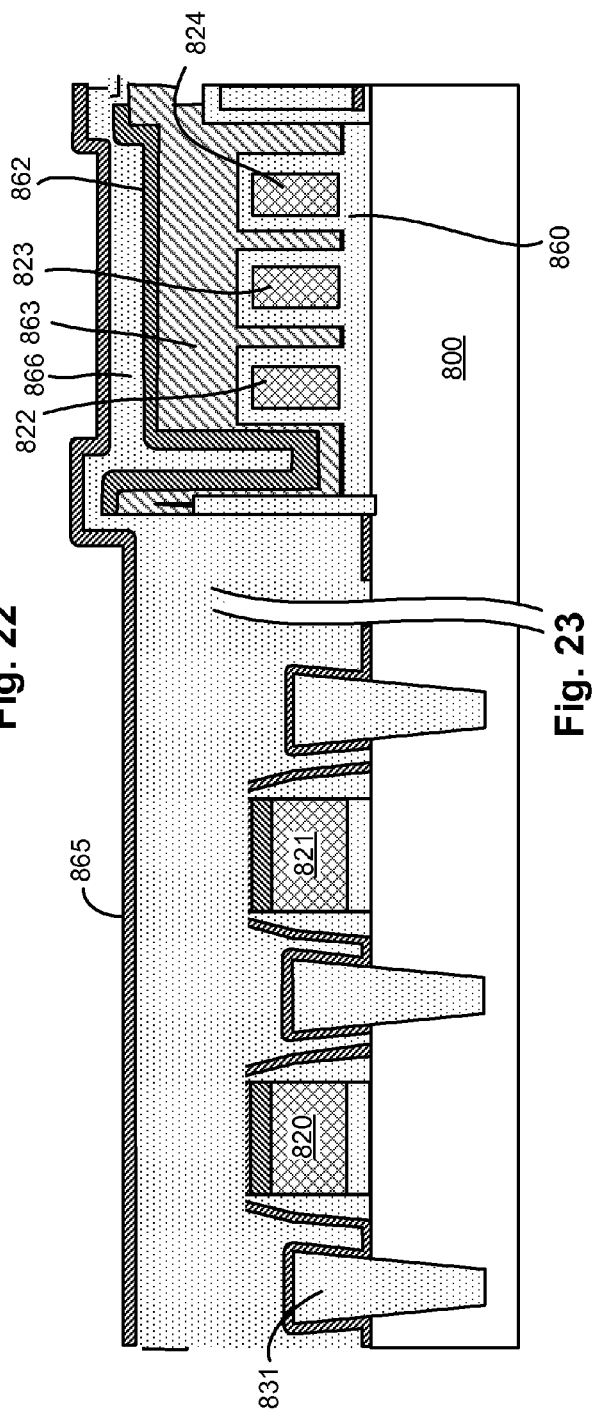

FIG. 23 illustrates the structure after deposition of a buffer oxide layer 866 and silicon nitride liner 865, in preparation for formation of overlying conductor layers and interlayer contacts.

Figure 24:
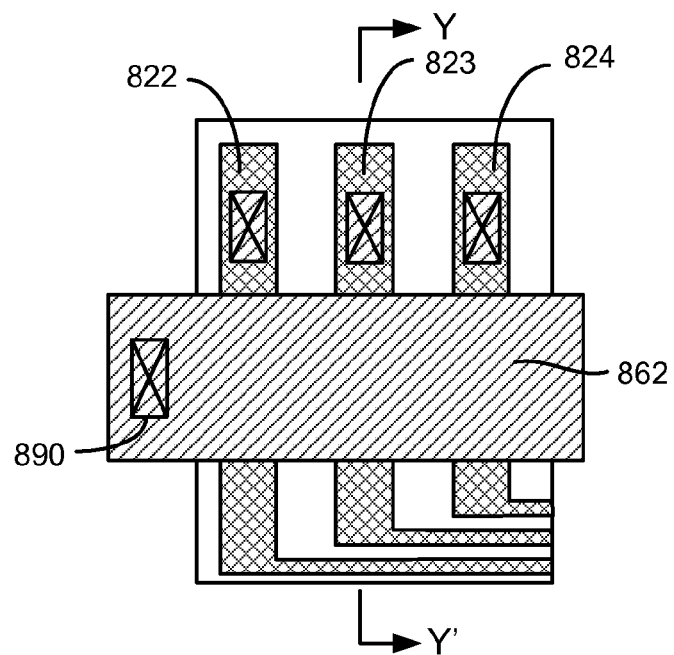

FIG. 24 illustrates a layout view of the vertical segments 822, 823 and 824 of local word line strips, with the overlying select gate (from conductor layer 862). An interlayer contact 890 is formed on the select gate.

Figure 25:
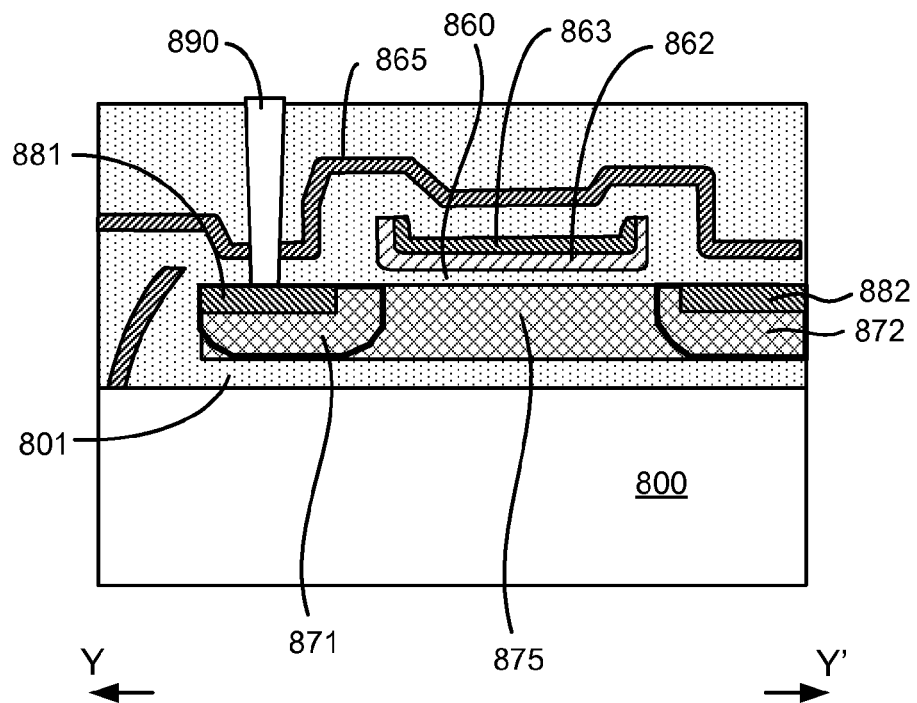

FIG. 25 illustrates a cross-section view taken on the line Y-Y' of FIG. 24. The cross-section illustrates a semiconductor substrate 800, with an overlying insulating layer 801. The semiconductor channel body 875 underlies a select gate structure (from layer 862). The layer of silicide 863 overlies the polysilicon of the select gate structure formed in layer 862. A gate dielectric layer 860 separates the select gate structure formed from layer 862 from the semiconductor channel body 875. A source/drain region 871 which is conductively doped includes a silicide layer 881, and a contact plug providing the interlayer contact 890 for connection to an overlying global word line. Source/drain region 872 which is conductively doped, includes a silicide layer 882, and extends to the segment of the local word line which reaches into the memory array.

The technology is described which can be applied to reduce the area required for implementation of a high density memory device that includes a plurality of blocks of memory cells, with local word lines. For example, NAND flash arrays can require local word line drivers in each block needing a high-voltage MOSFET transistor to act as a pass transistor to transfer specific word line voltages to a local word line from a global word line. These pass transistor structures are sometimes called a local word line driver. In technology such as the 3DVG structure shown in FIG. 2, the local word line driver circuits can be as much is 100 microns wide for one block with 66 local word lines, even when the local word line pitch is on the order of 100 nm. By implementing pass transistor structures in the local word line fanout structure, significant area savings are achieved.

In the examples described above, the pass transistor structures are implemented in local word line features. Pass transistor structures as described herein can be applied in a row/column line utilized for a ground select line or for a string select line in an NAND flash memory. Also, the pass transistor structure can be utilized for other types of decoder, including for example column decoders utilized for bit lines.

By integrating the pass transistors into the fanout regions for row/column line structures, significant savings in the decoder layout area is achieved. As result, a smaller overall die size can be achieved for a high density memory device. Also, the modification is cost-effective because of the area savings in the slight modification required for manufacturing sequences. Furthermore, direct connection from for example, the local word line to the global word line can improve RC delay performance.

Prior art local word line decoders utilizing triple well pass transistors require high breakdown devices in a configuration making it hard to adjust the implant conditions for the device. Utilizing the methods described herein, the thin film transistor pass transistor structure can be decoupled from the process used in formation of the peripheral circuits, allowing for more flexible implant fine-tuning. Furthermore, utilizing a thin film device isolated from an underlying substrate, there is no requirement for a triple well structure to avoid disturbance of the substrate, even when negative voltages are being applied.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

What is claimed is:
1. A device comprising:
 a substrate;
 an array of memory cells on the substrate, including a row/column line;
 the row/column line including a pass transistor structure comprising a semiconductor strip in a first patterned layer over the substrate, the semiconductor strip including a semiconductor channel body insulated from the substrate by a layer of dielectric, a contact region on one side of the semiconductor channel body, and an extension on another side of the semiconductor channel body, the extension coupled to memory cells in the array;
 a select line in a second patterned layer crossing the semiconductor channel body;
 a row/column line select signal generator which produces a select signal, connected to the select line; and
 a row/column line voltage generator which produces a row/column line voltage, connected to the contact region.

2. The device of claim 1, wherein the array includes a plurality of blocks of memory cells, said row/column line being one of a plurality of local word lines disposed in one of the blocks, local word lines in the plurality of local word lines including respective pass transistor structures.

3. The device of claim 2, wherein the select line crosses semiconductor channel bodies in pass transistor structures of more than one of the plurality of local word lines in said one of the blocks.

4. The device of claim 2, wherein the row/column line voltage generator includes connections to contact regions in pass transistor structures of more than one of the plurality of local word lines in said one of the blocks, and generates word line voltages for said more than one of the plurality of local word lines.

5. The device of claim 2, wherein the row/column line voltage generator comprises a global word line driver coupled to contact regions in pass transistor structures of local word lines in more than one of the plurality of blocks.

6. The device of claim 1, wherein the semiconductor channel body comprises a plurality of semiconductor stripes.

7. The device of claim 1, wherein the row/column line select signal generator includes a level shifter, and produces the select signal at a voltage level sufficient as compared to the row/column line voltage, to turn on the pass transistor structure when the row/column line is selected.

8. The device of claim 1, wherein said one of said blocks comprises a 3D sub-array of the array of memory cells.

9. The device of claim 1, wherein the semiconductor channel body of the semiconductor strip has a first width, and the extension of the semiconductor strip has a second width, the second width being less than the first width.

10. The device of claim 9, wherein the semiconductor channel body of the semiconductor strip has a channel length disposed in a first direction, and the extension of the semiconductor strip is disposed in a second direction, orthogonal to the first direction.

11. A memory device, comprising:
 a plurality of blocks of memory cells, blocks in the plurality of blocks including respective sets of local word lines, the local word lines in the sets comprising respective pass transistor structures, including a semiconductor channel body over the substrate and insulated from the substrate by a layer of dielectric, a contact region on one side of the semiconductor channel body, and an extension on another side of the semiconductor channel body, the extension coupled to memory cells in a corresponding one of the blocks;
 a plurality of local block select lines coupled with corresponding blocks in the plurality of blocks, a local block select line in the plurality of local block select lines crossing the pass transistor channel bodies of the pass transistor structures of more than one of the local word lines in the set of local word lines in the corresponding block; and
 a plurality of global word lines, a global word line in the plurality being connected to the contact regions of the pass transistor structures in corresponding local word lines in more than one block in the plurality of blocks.

12. The device of claim 11, including:
 local block select circuits connected to corresponding local block select lines in the plurality of local block select lines, the local block select circuits including level shifters, and producing the select signals at a voltage levels sufficient as compared to a word line voltage applied to the global word lines, to turn on the corresponding pass transistor structures of local word lines in selected blocks.

13. The device of claim 11, including a global word line driver coupled to the plurality of global word lines.

14. The device of claim 11, wherein the pass transistor structures respectively comprise a semiconductor strip in a first patterned layer over the substrate, the semiconductor strip including a semiconductor channel body, a contact region on one side of the semiconductor channel body, and an extension on another side of the semiconductor channel body, the extension coupled to memory cells in the array.

15. The device of claim 11, wherein the plurality of local word lines in a particular block of the plurality of blocks includes a fanout structure, and the pass transistor structures are disposed in the fanout structure.

16. The device of claim 11, wherein the semiconductor channel body comprises a plurality of semiconductor stripes.

17. A method for manufacturing, comprising:
    forming local word lines on a substrate, the local word lines including semiconductor strips in a first patterned layer, the semiconductor strips including a semiconductor channel body over the substrate and insulated from the substrate by a layer of dielectric, a contact region on one side of the semiconductor channel body, and an extension on another side of the semiconductor channel body;
    forming select lines overlying the semiconductor channel bodies of the word lines; and
    forming global word lines, the global word lines contacting corresponding contact regions of the local word lines.

18. The method of claim 17, wherein the local word lines are disposed in blocks with corresponding fanout regions, and the semiconductor channel bodies are disposed in the fanout regions.

19. The method of claim 17, wherein the semiconductor strips are formed in a first patterned layer, the select lines are formed in a second patterned layer overlying the first patterned layer and the global word lines are disposed in a third patterned layer overlying the second patterned layer.

20. The method of claim 17, wherein said forming local word lines includes forming a patterned semiconductor layer including the semiconductor strips, implanting impurities in the semiconductor strips while masking the semiconductor channel bodies to increase conductivity of the strips outside the semiconductor channel bodies.

* * * * *